US012316329B2

(12) United States Patent
Yamamoto et al.

(10) Patent No.: US 12,316,329 B2
(45) Date of Patent: May 27, 2025

(54) ZERO-CROSS DETECTION DEVICE AND LOAD DRIVING SYSTEM

(71) Applicant: Rohm Co., Ltd., Kyoto (JP)

(72) Inventors: Natsuki Yamamoto, Kyoto (JP); Satoru Nate, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 70 days.

(21) Appl. No.: 18/309,892

(22) Filed: May 1, 2023

(65) Prior Publication Data

US 2023/0378949 A1 Nov. 23, 2023

(30) Foreign Application Priority Data

May 19, 2022 (JP) ................................ 2022-082098

(51) Int. Cl.
*H03K 5/1536* (2006.01)
*G01R 19/04* (2006.01)
*G01R 19/175* (2006.01)

(52) U.S. Cl.
CPC ........... *H03K 5/1536* (2013.01); *G01R 19/04* (2013.01); *G01R 19/175* (2013.01)

(58) Field of Classification Search
USPC .................................................... 327/78–79
See application file for complete search history.

(56) References Cited

U.S. PATENT DOCUMENTS

| 3,767,938 | A | * | 10/1973 | Kueper | H03K 5/1536 327/79 |
| 6,255,864 | B1 | * | 7/2001 | Culca | H02H 3/24 327/78 |
| 7,271,579 | B2 | * | 9/2007 | Shimada | G01R 19/16538 324/111 |
| 8,179,250 | B2 | * | 5/2012 | Yang | H02M 5/2573 340/12.32 |
| 8,482,391 | B2 | * | 7/2013 | Yang | H02M 5/2573 370/215 |
| 11,397,201 | B2 | * | 7/2022 | Culca | H03K 5/153 |
| 2005/0151567 | A1 | * | 7/2005 | Shimada | G01R 19/16538 327/78 |
| 2020/0158766 | A1 | | 5/2020 | Nate et al. | |

FOREIGN PATENT DOCUMENTS

WO 2019/026706 A1 2/2019

* cited by examiner

*Primary Examiner* — Thomas J. Hiltunen
(74) *Attorney, Agent, or Firm* — Fish & Richardson P.C.

(57) ABSTRACT

A zero-cross detection device includes: an input terminal configured to receive an input voltage via a diode from an application terminal for an alternating-current voltage relative to a reference potential; an input circuit including a resistor between the input terminal and a terminal at the reference potential; a period detection circuit configured to detect the length of the period of the alternating-current voltage based on the interval of the timings at which the input voltage exceeds a threshold voltage; a peak detection circuit configured to detect the peak timing at which the input voltage reaches a peak in each period of the alternating-current voltage; and a zero-cross timing detection circuit configured to detect the zero-cross timing of the alternating-current voltage based on the results of detection by the period detection circuit and the peak detection circuit.

19 Claims, 4 Drawing Sheets

FIG.5

ZERO-CROSS DETECTION DEVICE AND LOAD DRIVING SYSTEM

CROSS-REFERENCE TO RELATED APPLICATIONS

This nonprovisional application claims priority under 35 U.S.C. § 119(a) on Patent Application No. 2022-082098 filed in Japan on May 19, 2022, the entire contents of which are hereby incorporated by reference.

BACKGROUND OF THE DISCLOSURE

1. Field of the Disclosure

The present disclosure relates to a zero-cross detection device and to a load driving system.

2. Description of Related Art

Wide use is made of devices that detect the zero-crossing of an alternating-current voltage. Devices of this kind are basically for use in systems in which an alternating-current voltage is subjected to full-wave rectification.
Patent Document 1: WO 2019/026706
Some other systems employ half-wave rectification, so there is demand for a zero-cross detection technology that is compatible with half-wave rectification.

SUMMARY OF THE DISCLOSURE

An object of the present disclosure is to provide a zero-cross detection device and a load driving system that are compatible with half-wave rectification.

According to one aspect of the present disclosure, a zero-cross detection device includes: an input terminal configured to receive an input voltage via a diode from an application terminal for an alternating-current voltage relative to a reference potential; an input circuit including a resistor between the input terminal and a terminal at the reference potential; a period detection circuit configured to detect the length of the period of the alternating-current voltage based on the interval of the timings at which the input voltage exceeds a threshold voltage; a peak detection circuit configured to detect the peak timing at which the input voltage reaches a peak in each period of the alternating-current voltage; and a zero-cross timing detection circuit configured to detect the zero-cross timing of the alternating-current voltage based on the results of detection by the period detection circuit and the peak detection circuit.

According to the present disclosure, it is possible to provide a zero-cross detection device and a load driving system that are compatible with half-wave rectification.

DETAILED DESCRIPTION OF PREFERRED EMBODIMENTS

Hereinafter, examples of implementing the present disclosure will be described specifically with reference to the accompanying drawings. Among the diagrams referred to in the course, the same parts are identified by the same reference signs, and in principle no overlapping description of the same parts will be repeated. In the present description, for the sake of simplicity, symbols and reference signs referring to information, signals, physical quantities, functional blocks, circuits, elements, parts, and the like are occasionally used with omission or abbreviation of the names of the information, signals, physical quantities, functional blocks, circuits, elements, parts, and the like corresponding to those symbols and reference signs.

First, some of the terms used to describe embodiments of the present disclosure will be defined. "Level" denotes the level of a potential, and for any signal or voltage of interest, "high level" has a higher potential than "low level". For any signal or voltage of interest, its being at high level means, more precisely, its level being equal to high level, and its being at low level means, more precisely, its level being equal to low level. A level of a signal is occasionally referred to as a signal level, and a level of a voltage is occasionally referred to as a voltage level. For any signal or voltage, a transition from low level to high level is termed an up edge, and the timing of a transition from low level to high level is termed an up-edge timing. "Up edge" can be read as "rising edge". Likewise, for any signal or voltage, a transition from high level to low level is termed a down edge, and the timing of a transition from high level to low level is termed a down-edge timing. "Down edge" can be read as "falling edge". Wherever "connection" is discussed among a plurality of parts constituting a circuit, as among circuit elements, wirings, nodes, and the like, the term is to be understood to denote "electrical connection".

With the spread of Wi-Fi (registered trademark), AI speakers, and the like, various kinds of load devices are expected to stay ready to receive radio waves and are often required to be kept supplied with electric power all the time. On the other hand, load devices are expected to be low in standby power consumption. This can be coped with effectively by zero-cross detection (detection of zero-crossing of an alternating-current voltage). Inconveniently, zero-cross detection devices are generally designed for use in systems that employ full-wave rectification and are incompatible with systems that employ half-wave rectification. In particular, for example, most lighting devices that are driven with an alternating-current voltage employ half-wave rectification and do not permit the use of zero-cross detection devices designed for full-wave rectification. As an embodiment of the present disclosure, a zero-cross detection device that is compatible with half-wave rectification will be presented below.

Figure 1:
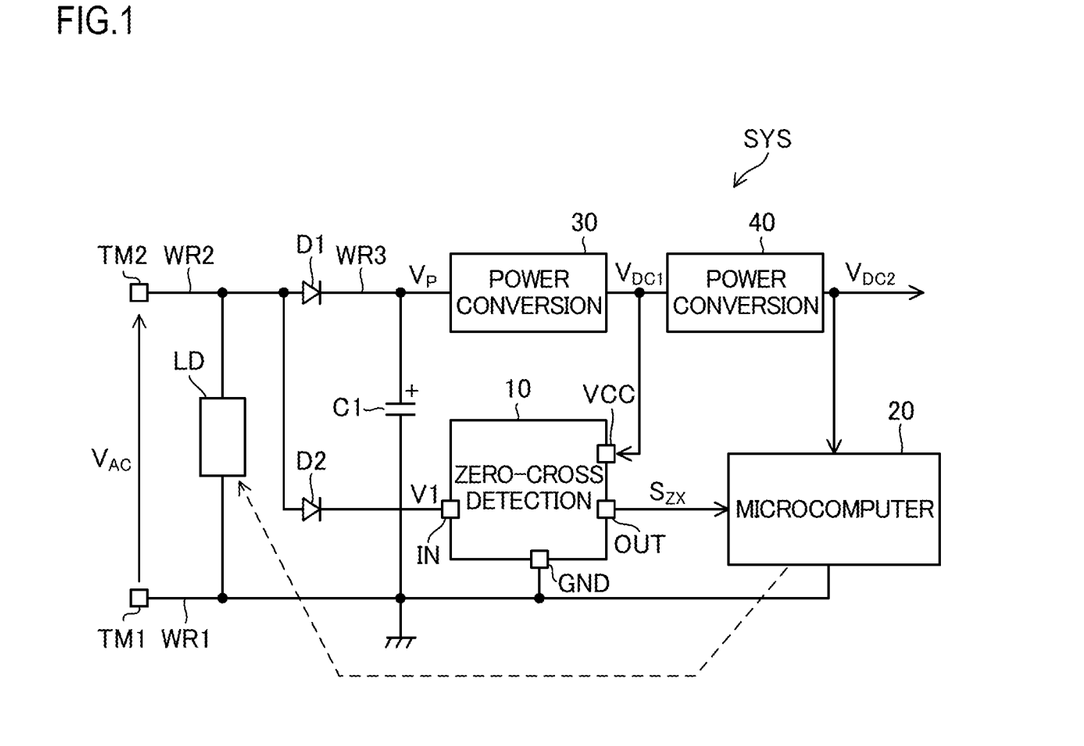
FIG. 1 is an overall configuration diagram of a load driving system according to an embodiment of the present disclosure.

FIG. 1 is an overall configuration diagram of a load driving system SYS according to the embodiment of the present disclosure. The load driving system SYS includes a pair of power input terminals TM1 and TM2, a zero-cross detection IC 10 as one example of a zero-cross detection device, a microcomputer 20, power conversion circuits 30 and 40, rectifying diodes D1 and D2, an input capacitor C1, and a load device LD. In the following description, the zero-cross detection IC 10 will often be referred to simply as the IC 10.

Figure 2:
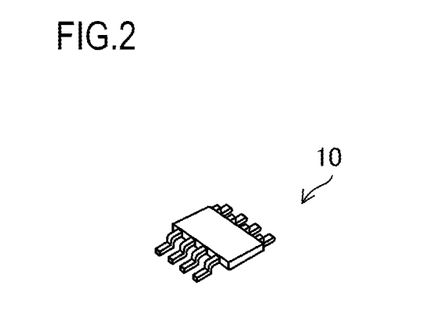
FIG. 2 is an exterior perspective view of a zero-cross detection IC according to the embodiment of the present disclosure.

FIG. 2 is an exterior perspective view of the IC 10. The IC 10 is an electronic component composed of a semiconductor chip having a semiconductor integrated circuit formed on a semiconductor substrate, a package (housing) in which the semiconductor chip is housed, and a plurality of external terminals that are led out of the package to be exposed outside the IC 10. The IC 10 is fabricated by sealing the semiconductor chip into the package (housing) formed of resin. Note that the number of external terminals on the IC 10 and the type of the package of the IC 10 shown in FIG. 2 are merely illustrative and can be designed in any other way. While FIG. 1 shows, as being included in the plurality of external terminals mentioned above, a power terminal VCC, an input terminal IN, a ground terminal GND, and a signal output terminal OUT, the IC 10 also has external terminals other than those.

From an external alternating-current voltage source (not illustrated), an alternating-current voltage $V_{AC}$ is supplied to the pair of power input terminals TM1 and TM2. The alternating-current voltage $V_{AC}$ can be a commercially distributed alternating-current voltage. The alternating-current voltage $V_{AC}$ is, for example, an alternating-current voltage of 100 V, 50 or 60 Hz (hertz). The alternating-current voltage $V_{AC}$ may be of any frequency and any magnitude. It is here assumed that the power input terminal TM1 is at a fixed ground potential (reference potential) and that the alternating-current voltage $V_{AC}$ relative to the ground potential is fed to the power input terminal TM2. Thus the power input terminal TM2 corresponds to an application terminal for the alternating-current voltage $V_{AC}$. The ground potential is 0 V (volts). Any wiring or metal part at the ground potential will be referred to also as the ground. In this embodiment, any voltage mentioned with no reference mentioned is a voltage relative to the ground potential.

The power input terminal TM1 is connected to a wiring WR1, and the power input terminal TM2 is connected to a wiring WR2. Thus the wiring WR1 is fed with the ground potential, and the wiring WR2 is fed with the alternating-current voltage $V_{AC}$. The load device LD is connected to the wirings WR1 and WR2, and is driven based on the alternating-current voltage $V_{AC}$.

The anodes of the rectifying diodes D1 and D2 are connected to the wiring WR2, and are thus fed with the alternating-current voltage $V_{AC}$. The cathode of the diode D1 and the positive pole of the input capacitor C1 are connected to a wiring WR3. The input capacitor C1 has a positive and a negative pole as two terminals, and receives a higher potential at the positive pole than at the negative pole. The negative pole of the input capacitor C1 is connected to the wiring WR1.

The rectifying diode D1 and the input capacitor C1 constitute a half-wave rectification circuit (half-wave rectification/smoothing circuit) that performs half-wave rectification and smoothing on the alternating-current voltage $V_{AC}$, and this half-wave rectification circuit produces a pulsating voltage $V_P$ on the wiring WR3. Specifically, the alternating-current voltage $V_{AC}$ is subjected to half-wave rectification by the rectifying diode D1, and the voltage resulting from half-wave rectification by the rectifying diode D1 is smoothed by the input capacitor C1, resulting in the pulsating voltage $V_P$ appearing on the wiring WR3.

Receiving the pulsating voltage $V_P$, the power conversion circuit 30 converts it into a direct-current voltage $V_{DC1}$. Receiving the direct-current voltage $V_{DC1}$, the power conversion circuit 40 converts it into a direct-current voltage $V_{DC2}$. The direct-current voltages $V_{DC1}$ and $V_{DC2}$ have mutually different positive direct-current voltage values respectively.

The power terminal VCC of the IC 10 is fed with the direct-current voltage $V_{DC1}$. The IC 10 operates using as its supply voltage the direct-current voltage fed to the power terminal VCC. Instead of the direct-current voltage $V_{DC1}$, the direct-current voltage $V_{DC2}$ may be supplied to the power terminal VCC. To the input terminal IN of the IC 10, the cathode of the rectifying diode D2 is connected. The voltage fed to the input terminal IN will be identified by the symbol "V1" and referred to as the input voltage V1. The ground terminal GND of the IC 10 is connected to the wiring WR1. Thus the ground terminal GND is at the ground potential. The signal output terminal OUT of the IC 10 is connected to the microcomputer 20. The IC 10 outputs from the signal output terminal OUT a zero-cross detection signal $S_{ZX}$ to feed it to the microcomputer 20.

The microcomputer 20 is connected to the output terminal of the power conversion circuit 40 and to the wiring WR1, and operates using as its supply voltage the direct-current voltage $V_{DC2}$ output from the power conversion circuit 40. The load driving system SYS may include any other load (not illustrated) that operates from the direct-current voltage $V_{DC1}$ or $V_{DC2}$. The microcomputer 20 functions as a control device with respect to the load device LD. Based on the zero-cross detection signal $S_{ZX}$, the microcomputer 20 controls the operation of the load device LD. For example, in a case where the load device LD is a lighting device with a dimming function, based on the zero-cross detection signal $S_{ZX}$ the microcomputer 20 controls the lighting luminance of (illuminance by) the lighting device.

Figure 3:
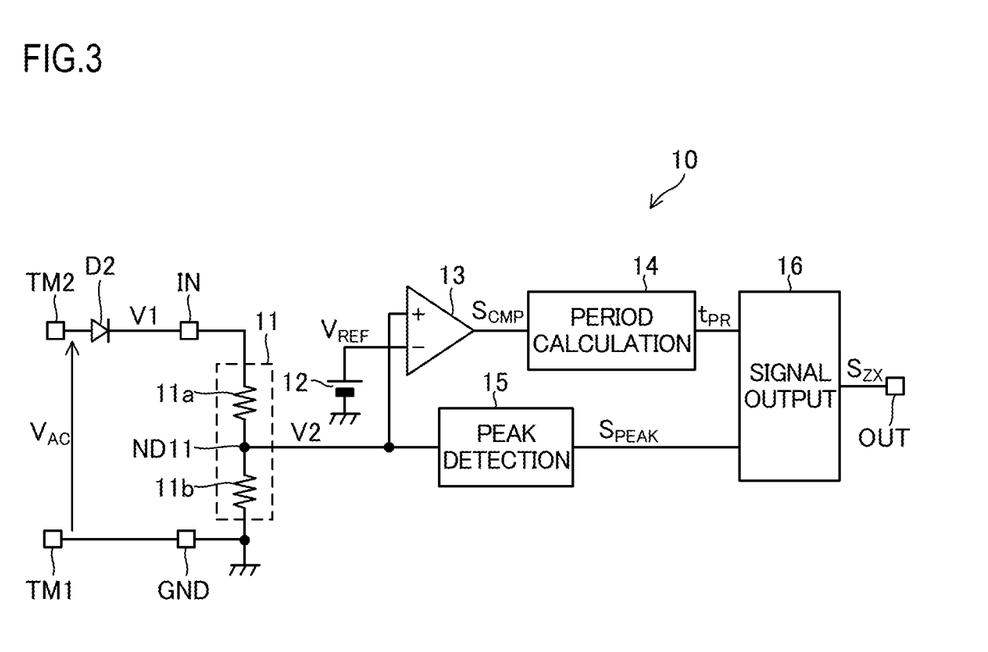
FIG. 3 is an internal configuration diagram of the zero-cross detection IC according to the embodiment of the present disclosure.

FIG. 3 shows the internal configuration of the IC 10. The IC 10 includes an input circuit 11, a voltage source 12, a comparator 13, a period calculation circuit 14, a peak detection circuit 15, and a signal output circuit 16.

The input circuit 11 includes one or more resistors provided between the input terminal IN and the ground. It is here assumed that the input circuit 11 is a voltage division circuit composed of a series circuit of voltage division resistors 11a and 11b. The first terminal of the voltage division resistor 11a is connected to the input terminal IN to receive the input voltage V1. The second terminal of the voltage division resistor 11a is connected, at a node ND11, to the first terminal of the voltage division resistor 11b. The second terminal of the voltage division resistor 11b is connected to the ground (that is, it is connected to the ground terminal GND at the ground potential). At the node ND11 appears a division voltage of the input voltage V1, and this division voltage (i.e., the voltage appearing at the node ND11) will be referred to as the reference voltage V2. The resistance values of the voltage division resistors 11a and 11b will be represented by R11a and R11b respectively. The reference voltage V2 is then given by V2=V1×R11b/(R11a+ R11b). The voltage division resistors 11a and 11b may each be configured as a series circuit of a plurality of resistive elements.

The voltage source 12 generates and outputs a predetermined direct-current voltage as a judgment voltage $V_{REF}$. The judgment voltage $V_{REF}$ has a positive direct-current voltage value (e.g., two volts) relative to the ground potential.

The comparator 13 has an inverting input terminal, a non-inverting input terminal, and an output terminal. The non-inverting input terminal of the comparator 13 is connected to the node ND11 to receive the reference voltage V2. The inverting input terminal of the comparator 13 is fed with the judgment voltage $V_{REF}$. The comparator 13 compares the reference voltage V2 with the judgment voltage $V_{REF}$, and feeds a comparison result signal $S_{CMP}$ indicating their magnitude relationship to the period calculation circuit 14. The comparison result signal $S_{CMP}$ is a binary signal of which the signal level is high or low at a time. The comparator 13 outputs a high-level comparison result signal $S_{CMP}$ if the reference voltage V2 is higher than the judgment voltage $V_{REF}$, and outputs a low-level comparison result signal $S_{CMP}$ if the reference voltage V2 is lower than the judgment voltage $V_{REF}$. If the reference voltage V2 and the judgment voltage $V_{REF}$ are just equal, the comparison result signal $S_{CMP}$ has either high or low level.

Based on the comparison result signal $S_{CMP}$ from the comparator 13, the period calculation circuit 14 derives and detects the length of the period of the alternating-current voltage $V_{AC}$. In this way the comparator 13 and the period calculation circuit 14 cooperate to constitute a period detection circuit that detects the length of the period of the alternating-current voltage $V_{AC}$. In the following description, the length of the period of the alternating-current voltage $V_{AC}$ will be referred to as the period length and represented by the symbol "$t_{PR}$". The derived period length $I_{PR}$ is fed from the period calculation circuit 14 to the signal output circuit 16. The period length $t_{PR}$ is the length of time of one period of the alternating-current voltage $V_{AC}$. Thus, for example, in a case where the alternating-current voltage $V_{AC}$ has a frequency of 50 Hz, if the period length $t_{PR}$ derived by the period calculation circuit 14 contains no error, the derived period length $t_{RP}$ is 20 milliseconds.

The peak detection circuit 15 is connected to the node ND11 to receive the reference voltage V2. Based on the reference voltage V2, the peak detection circuit 15 detects the timing at which the input voltage V1 reaches a peak within each period of the alternating-current voltage $V_{AC}$ and generates and outputs a peak detection signal $S_{PEAK}$ that indicates the detection result. The peak detection signal $S_{PEAK}$ is fed from the peak detection circuit 15 to the signal output circuit 16.

The signal output circuit 16 functions as a zero-cross timing detection circuit and, based on the period length $t_{RP}$ and the peak detection signal $S_{PEAK}$, detects the zero-cross timing of the alternating-current voltage $V_{AC}$. The signal output circuit 16 then generates and outputs as the zero-cross detection signal $S_{ZX}$ a signal indicating the result of zero-cross timing detection. The zero-cross detection signal $S_{ZX}$ is fed from the signal output circuit 16 via the output terminal OUT to the microcomputer 20.

The zero-cross timing of the alternating-current voltage $V_{AC}$ denotes the timing at which a zero-crossing of the alternating-current voltage $V_{AC}$ occurs. A zero-crossing of the alternating-current voltage $V_{AC}$ can be a negative-to-positive zero-crossing of the alternating-current voltage $V_{AC}$ or a positive-to-negative zero-crossing of the alternating-current voltage $V_{AC}$. A negative-to-positive zero-crossing of the alternating-current voltage $V_{AC}$ denotes, specifically, a switch of its instantaneous value from a negative to a positive value. The timing at which the instantaneous value of the alternating-current voltage $V_{AC}$ equals zero while switching from a negative to a positive value (i.e., the timing at which the potential difference between the power input terminals TM1 and TM2 equals zero) is a negative-to-positive zero-crossing timing of the alternating-current voltage $V_{AC}$. A positive-to-negative zero-crossing of the alternating-current voltage $V_{AC}$ denotes, specifically, a switch of its instantaneous value from a positive to a negative value. The timing at which the instantaneous value of the alternating-current voltage $V_{AC}$ equals zero while switching from a positive to a negative value (i.e., the timing at which the potential difference between the power input terminals TM1 and TM2 equals zero) is a positive-to-negative zero-crossing timing of the alternating-current voltage $V_{AC}$.

Figure 4:
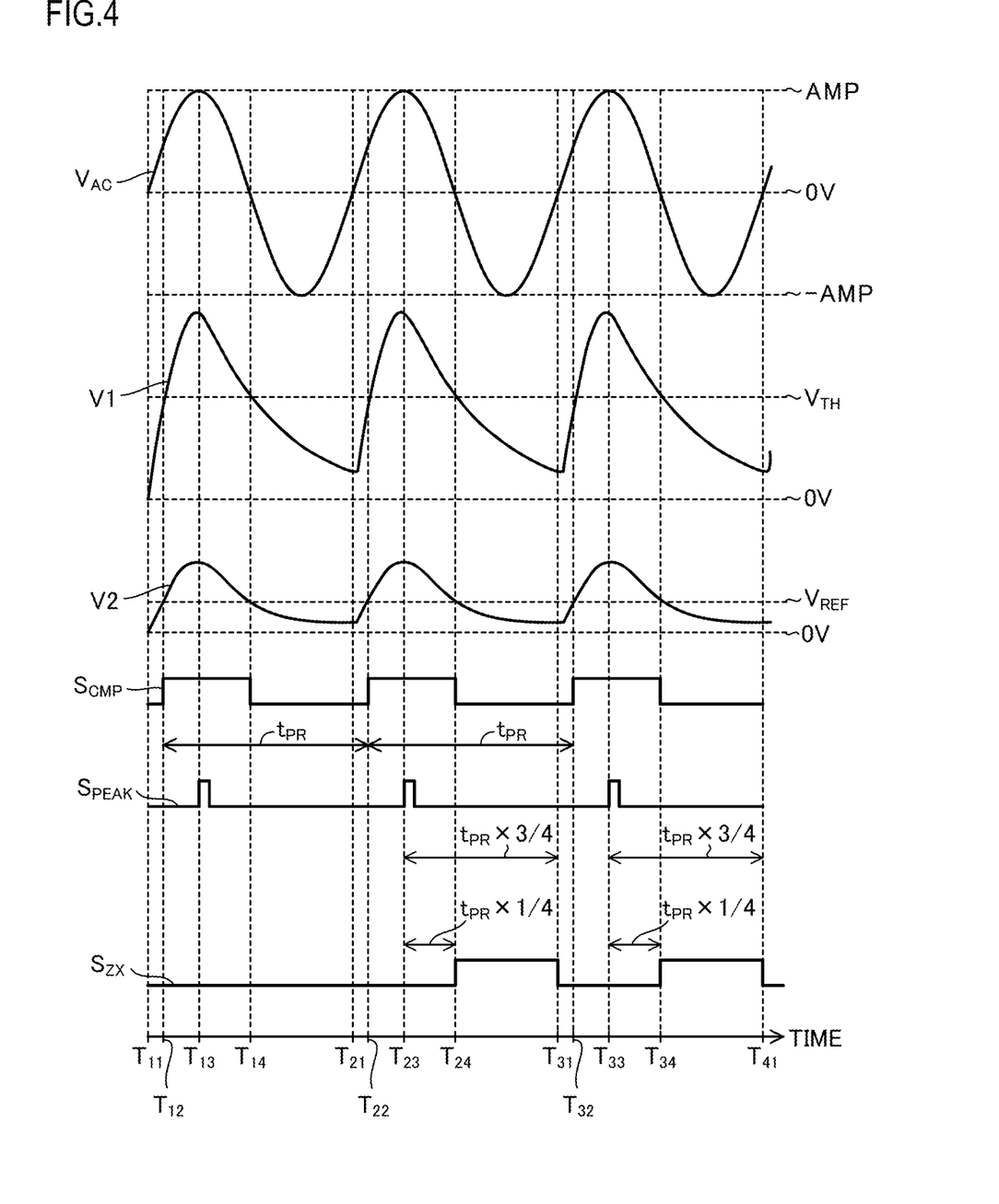
FIG. 4 is a timing chart with respect to the operation of the zero-cross detection IC according to the embodiment of the present disclosure.

FIG. 4 is a timing chart with respect to the operation of the IC 10. FIG. 4 shows the waveforms of, from top down, the alternating-current voltage $V_{AC}$, the input voltage V1, the reference voltage V2, the comparison result signal $S_{CMP}$, the peak detection signal $S_{PEAK}$, and the zero-cross detection signal $S_{ZX}$, each with a solid line. The alternating-current voltage $V_{AC}$ has a sinusoidal waveform, and the value of the amplitude of the alternating-current voltage $V_{AC}$ will be referred to as the amplitude value AMP (AMP>0).

Assume that, at the moment that the instantaneous value of the alternating-current voltage $V_{AC}$ in the process of rising equals zero, the phase of the alternating-current voltage $V_{AC}$ is 0°. Under this assumption, when the phase of the alternating-current voltage $V_{AC}$ is 90°, the instantaneous value of the alternating-current voltage $V_{AC}$ equals the amplitude value AMP, and when the phase of the alternating-current voltage $V_{AC}$ is 270°, the instantaneous value of the alternating-current voltage $V_{AC}$ equals the value (−AMP). When the phase of the alternating-current voltage $V_{AC}$ is 180°, the instantaneous value of the alternating-current voltage $V_{AC}$ equals zero. Thus the timing at which the phase of the alternating-current voltage $V_{AC}$ is 0° is the negative-to-positive zero-cross timing of the alternating-current voltage VAC and the timing at which the phase of the alternating-current voltage $V_{AC}$ is 180° is the positive-to-negative zero-cross timing of the alternating-current voltage $V_{AC}$.

The period of the alternating-current voltage $V_{AC}$ that occurs first after the start-up of the IC 10 is taken as the first period of the alternating-current voltage $V_{AC}$. Time point $_{11}$ is the negative-to-positive zero-cross timing in the first period of the alternating-current voltage $V_{AC}$, and at time point $T_{11}$ the instantaneous value of the alternating-current voltage $V_{AC}$ is zero. The period from time point $T_{11}$ to immediately before time point $T_{21}$, which will be mentioned later, belongs to the first period of the alternating-current voltage $V_{AC}$. From time point $T_{11}$ via time point $T_{12}$ to time point $T_{13}$, the instantaneous value of the alternating-current voltage $V_{AC}$ increases monotonically, and at time point Tia the instantaneous value of the alternating-current voltage $V_{AC}$ becomes equal to the amplitude value AMP. Starting at time point $T_{13}$ the instantaneous value of the alternating-current voltage $V_{AC}$ decreases monotonically from the amplitude value AMP to the value (−AMP) and, during the process of the decrease, at time point $T_{14}$ the instantaneous value of the alternating-current voltage $V_{AC}$ becomes zero. That is, time point $T_{14}$ is the positive-to-negative zero-cross timing in the first period of the alternating-current voltage $V_{AC}$. After time point $T_{14}$, still in the first period of the alternating-current voltage $V_{AC}$, the instantaneous value of the alternating-current voltage $V_{AC}$ decreases down to the value (−AMP), at which point the instantaneous value of the alternating-current voltage $V_{AC}$ starts to increase, so that at time point $T_{21}$ the instantaneous value of the alternating-current voltage $V_{AC}$ reaches zero.

Time point $T_{21}$ is the negative-to-positive zero-cross timing in the second period of the alternating-current voltage $V_{AC}$, and at time point $T_{21}$ the instantaneous value of the alternating-current voltage $V_{AC}$ is zero. The period from time point $T_{21}$ to immediately before time point $T_{31}$, which will be mentioned later, belongs to the second period of the alternating-current voltage $V_{AC}$. From time point $T_{21}$ via time point $T_{22}$ to time point $T_{23}$, the instantaneous value of the alternating-current voltage $V_{AC}$ increases monotonically, and at time point $T_{23}$ the instantaneous value of the alternating-current voltage $V_{AC}$ becomes equal to the amplitude value AMP. Starting at time point $T_{23}$ the instantaneous value of the alternating-current voltage $V_{AC}$ decreases monotonically from the amplitude value AMP to the value (−AMP) and, during the process of the decrease, at time point $T_{24}$ the instantaneous value of the alternating-current voltage $V_{AC}$ becomes zero. That is, time point $T_{24}$ is the positive-to-negative zero-cross timing in the second period of the alternating-current voltage $V_{AC}$. After time point $T_{24}$, still in the second period of the alternating-current voltage $V_{AC}$, the instantaneous value of the alternating-current voltage $V_{AC}$ decreases down to the value (−AMP), at which point the instantaneous value of the alternating-current voltage $V_{AC}$ starts to increase, so that at time point $T_{31}$ the instantaneous value of the alternating-current voltage $V_{AC}$ reaches zero.

Time point $T_{31}$ is the negative-to-positive zero-cross timing in the third period of the alternating-current voltage $V_{AC}$, and at time point $T_{31}$ the instantaneous value of the alternating-current voltage $V_{AC}$ is zero. The period from time point $T_{31}$ to immediately before time point $T_{41}$, which will be mentioned later, belongs to the third period of the alternating-current voltage $V_{AC}$. From time point $T_{31}$ via time point $T_{32}$ to time point $T_{33}$, the instantaneous value of the alternating-current voltage $V_{AC}$ increases monotonically, and at time point $T_{33}$ the instantaneous value of the alternating-current voltage $V_{AC}$ becomes equal to the amplitude value AMP. Starting at time point $T_{33}$ the instantaneous value of the alternating-current voltage $V_{AC}$ decreases monotonically from the amplitude value AMP to the value (−AMP) and, during the process of the decrease, at time point $T_{34}$ the instantaneous value of the alternating-current voltage $V_{AC}$ becomes zero. That is, time point $T_{34}$ is the positive-to-negative zero-cross timing in the third period of the alternating-current voltage $V_{AC}$. After time point $T_{34}$, still in the third period of the alternating-current voltage $V_{AC}$, the instantaneous value of the alternating-current voltage $V_{AC}$ decreases down to the value (—AMP), at which point the instantaneous value of the alternating-current voltage $V_{AC}$ starts to increase, so that at time point $T_{41}$ the instantaneous value of the alternating-current voltage $V_{AC}$ reaches zero.

The alternating-current voltage $V_{AC}$ is subjected to half-wave rectification by the rectifying diode D2, and the voltage resulting from the half-wave rectification is fed, as the input voltage V1, to the input terminal IN. Suppose that, at time point $T_{11}$, the input voltage V1 is 0 V. Then, in the first period of the alternating-current voltage $V_{AC}$, the input voltage V1 increases monotonically from time point $T_{11}$ via time point $T_{12}$ to time point $T_{13}$ and thereafter decreases monotonically.

The parasitic capacitances (not illustrated) present in parallel with the voltage division resistors 11a and 11b respectively act to prevent, after time point $T_{11}$, the input voltage V1 from falling down to 0 V in each period of the alternating-current voltage $V_{AC}$. In the second period of the alternating-current voltage $V_{AC}$, a little time after time point $T_{21}$ the input voltage V1 starts to rise again and thereafter, via time point $T_{22}$ to time point $T_{23}$, the input voltage V1 increases monotonically; after time point $T_{23}$ the input voltage V1 decreases monotonically. Likewise, in the third period of the alternating-current voltage $V_{AC}$, a little time after time point $T_{31}$ the input voltage V1 starts to rise again and thereafter, via time point $T_{32}$ to time point $T_{33}$, the input voltage V1 increases monotonically; after time point $T_{33}$ the input voltage V1 decreases monotonically.

Being a division voltage of the input voltage V1, the reference voltage V2 increases and decreases in like manner as the input voltage V1. The input voltage V1 and the reference voltage V2 are pulsating voltages that vary cyclically, and the frequencies of the input voltage V1 and the reference voltage V2 are equal to that of the alternating-current voltage $V_{AC}$.

Time point $T_{12}$ is when, in the first period of the alternating-current voltage $V_{AC}$, a shift takes place from the state "V2<$V_{REF}$" to the state "V2>$V_{REF}$": at time point $T_{12}$, the first up edge occurs in the comparison result signal $S_{CMP}$. When thereafter, in the first period of the alternating-current voltage $V_{AC}$, a shift takes place from the state "V2>$V_{REF}$" to the state "V2 <$V_{REF}$", the first down edge occurs in the comparison result signal $S_{CMP}$. In the first period of the alternating-current voltage $V_{AC}$, a down edge in the comparison result signal $S_{CMP}$ may occur at time point $T_{14}$, or before or after time point $T_{14}$.

Likewise, time point $T_{22}$ is when, in the second period of the alternating-current voltage $V_{AC}$, a shift takes place from the state "V2<$V_{REF}$" to the state "V2>$V_{REF}$": at time point $T_{22}$, the second up edge occurs in the comparison result signal $S_{SCMP}$. When thereafter, in the second period of the alternating-current voltage $V_{AC}$, a shift takes place from the state "V2 >$V_{REF}$" to the state "V2<$V_{REF}$", the second down edge occurs in the comparison result signal $S_{CMP}$. In the second period of the alternating-current voltage $V_{AC}$, a down edge in the comparison result signal $S_{CMP}$ may occur at time point $T_{24}$, or before or after time point $T_{24}$.

Likewise, time point $T_{22}$ is when, in the third period of the alternating-current voltage $V_{AC}$, a shift takes place from the state "V2<$V_{REF}$" to the state "V2>$V_{REF}$": at time point $T_{32}$, the third up edge occurs in the comparison result signal $S_{CMP}$. When thereafter, in the third period of the alternating-current voltage $V_{AC}$, a shift takes place from the state "V2>$V_{REF}$" to the state "V2<$V_{REF}$", the third down edge occurs in the comparison result signal $S_{CMP}$. In the third period of the alternating-current voltage $V_{AC}$, a down edge in the comparison result signal $S_{CMP}$ may occur at time point $T_{34}$, or before or after time point $T_{34}$.

The state "V2<$V_{REF}$" is the state where the reference voltage V2 is lower than the judgment voltage $V_{REF}$, and the state "V2>$V_{REF}$" is the state where the reference voltage V2 is higher than the judgment voltage $V_{REF}$. The voltage $V_{TH}$ shown in FIG. 4 is a threshold voltage that fulfills $V_{TH} \times$ R11b/R11a+R11b)=$V_{REF}$. Accordingly, if V2<$V_{REF}$, then V1<$V_{TH}$, and if V2>$V_{REF}$, then V1>$V_{TH}$. The expressions "V2<$V_{REF}$" and "V1<$V_{TH}$" are thus equivalent to each other, and so are the expressions "V2>$V_{REF}$" and "V1>$V_{TH}$".

While it has been described that after time point $T_{11}$ the input voltage V1 does not fall down to 0 V in each period of the alternating-current voltage $V_{AC}$, this is not meant to preclude the alternating-current voltage $V_{AC}$ falling down to 0 V after time point $T_{11}$. In either case, the input circuit 11 is assumed to be configured such that, in each period of the alternating-current voltage $V_{AC}$, after an up edge occurs in the comparison result signal $S_{CMP}$, during the process of decrease of the instantaneous value of the alternating-current voltage $V_{AC}$ or during the period in which the instantaneous value of the alternating-current voltage $V_{AC}$ is negative, a shift from the state "V2>$V_{REF}$" to the state "V2<$V_{REF}$" takes place (in other word, a shift from the state "V1>$V_{TH}$" to the state "V1<$V_{TH}$" takes place).

Based on the reference voltage V2, the peak detection circuit 15 detects the timing at which the reference voltage V2 reaches a peak. The timing at which the reference voltage V2 reaches a peak will be referred to as the peak timing of the reference voltage V2. The peak timing of the reference voltage V2 denotes the timing at which the reference voltage V2 reaches a peak in each period of the reference voltage V2 (i.e., the timing at which the instantaneous value of the reference voltage V2 is at its maximum).

The timing at which the input voltage V1 reaches a peak in each period of the input voltage V1 (i.e., the timing at which the instantaneous value of the input voltage V1 is at its maximum) will be referred to as the peak timing of the input voltage V1. The timing at which the alternating-current voltage $V_{AC}$ reaches a peak in each period of the alternating-current voltage $V_{AC}$ (i.e., the timing at which the instantaneous value of the alternating-current voltage $V_{AC}$ is at its maximum) will be referred to as the peak timing of the alternating-current voltage $V_{AC}$. When the instantaneous value of the alternating-current voltage $V_{AC}$ equals its maximum value (the amplitude value AMP), the instantaneous value of input voltage V1 is at its maximum and the instantaneous value of the reference voltage V2 is at its maximum. Thus, in each period of the alternating-current voltage $V_{AC}$, the peak timing of the alternating-current voltage $V_{AC}$, the peak timing of the input voltage V1, and the peak timing of the reference voltage V2 coincide.

It can be understood that, by detecting the peak timing of the reference voltage V2 based on the reference voltage V2 in each period of the alternating-current voltage $V_{AC}$, the peak detection circuit 15 detects the peak timing of the input voltage V1 or the peak timing of the alternating-current voltage $V_{AC}$.

The peak detection signal $S_{PEAK}$ is, like the comparison result signal $S_{CMP}$, a binary signal of which the signal level is high or low at a time. The peak detection circuit 15 basically keeps the peak detection signal $S_{PEAK}$ at low level; it produces an up edge in the peak detection signal $S_{PEAK}$ at the timing at which the reference voltage V2 reaches a peak and, a very short period thereafter, produces a down edge in the peak detection signal $S_{PEAK}$. That is, the peak detection circuit 15 holds the peak detection signal $S_{PEAK}$ at high level for a very short time at the peak timing of the reference voltage V2. In the first, second, and third periods of the alternating-current voltage $V_{AC}$, time points $T_{13}$, $T_{23}$, and $T_{33}$ respectively correspond to the peak timing of the reference voltage V2, and thus the peak detection circuit 15 produces an up edge in the peak detection signal SPEAK at each of time points $T_{13}$, $T_{23}$, and $T_{33}$.

Based on the interval of the up-edge timings of the comparison result signal $S_{CMP}$, the period calculation circuit 14 derives and detects the period length $t_{PR}$ (the length of the period of the alternating-current voltage $V_{AC}$). At a given time point, the period calculation circuit 14 identifies, out of the up-edge timings of the comparison result signal $S_{CMP}$, the most recent two successive up-edge timings, and detects the interval between the so identified two up-edge timings as the period length $t_{PR}$. Accordingly, for example, in the second period of the alternating-current voltage $V_{AC}$, after time point $T_{22}$, time points $T_{12}$ and $T_{22}$ are identified as the above-mentioned two up-edge timings, and the interval between time points $T_{12}$ and $T_{22}$ is detected as the period length $t_{PR}$. Likewise, for example, in the third period of the alternating-current voltage $V_{AC}$, after time point $T_{32}$, time points $T_{22}$ and $T_{32}$ are identified as the above-mentioned two up-edge timings, and the interval between time points $T_{22}$ and $T_{32}$ is detected as the period length $t_{PR}$. A similar description applies to each of the fourth and subsequent periods of the alternating-current voltage $V_{AC}$.

An up edge in the comparison result signal $S_{CMP}$ occurs when the reference voltage V2 exceeds the judgment voltage $V_{REF}$; that is, one occurs at the timing of a shift from "V2<$V_{REF}$" to "V2>$V_{REF}$". Here, as mentioned above, "V2<$V_{REF}$" and "V1<$V_{TH}$" are equivalent to each other, and so are the expressions "V2>$V_{REF}$" and "V1>$V_{TH}$". Thus it can be understood that the period calculation circuit 14 derives and detects the period length $t_{PR}$ based on the interval of the timings at which the input voltage V1 exceeds the threshold voltage VTH (specifically, the timings of a shift from "V1<$V_{TH}$" to "V1>$V_{TH}$").

In each period of the alternating-current voltage $V_{AC}$, the signal output circuit 16 anticipates and detects a positive-to-negative zero-crossing of the alternating-current voltage $V_{AC}$ occurring at the lapse of a first delay time from an up-edge timing of the peak detection signal $S_{PEAK}$, and anticipates and detects a zero-negative-to-positive crossing of the alternating-current voltage $V_{Ac}$ occurring at the lapse of a second delay time from an up-edge timing of the peak detection signal $S_{PEAK}$. The first delay time equals one-fourth of the period length $t_{PR}$ derived by the period calculation circuit 14. The second delay time equals three-fourths of the period length $t_{PR}$ derived by the period calculation circuit 14.

The zero-cross detection signal $S_{ZX}$ is, like the comparison result signal $S_{CMP}$, a binary signal of which the signal level is high or low at a time. Before the period calculation circuit 14 derives the period length $t_{PR}$, the signal output circuit 16 keeps the zero-cross detection signal $S_{ZX}$ at low level. After the period calculation circuit 14 derives the period length $t_{PR}$, every time an up edge occurs in the peak detection signal $S_{PEAK}$, the signal output circuit 16 produces an up edge in the zero-cross detection signal $S_{ZX}$ at the lapse of the first delay time from the up-edge timing of the peak detection signal $S_{PEAK}$ and produces a down edge in the zero-cross detection signal $S_{ZX}$ at the lapse of the second delay time from the up-edge timing of the peak detection signal $S_{PEAK}$.

Thus, assuming no detection error in either of the period calculation circuit 14 and the peak detection circuit 15, the zero-cross detection signal $S_{ZX}$ has an up edge at time point $T_{24}$, a down edge at time point $T_{31}$, an up edge at time point $T_{34}$, and a down edge at time point $T_{41}$. An up edge in the zero-cross detection signal $S_{ZX}$ indicates a positive-to-negative zero-crossing of the alternating-current voltage $V_{AC}$. Accordingly, an up-edge timing of the zero-cross detection signal $S_{ZX}$ indicates a positive-to-negative zero-cross timing of the alternating-current voltage $V_{AC}$. A down edge in the zero-cross detection signal $S_{ZX}$ indicates a negative-to-positive zero-crossing of the alternating-current voltage $V_{AC}$. Accordingly, a down-edge timing of the zero-cross detection signal $S_{ZX}$ indicates a negative-to-positive zero-cross timing of the alternating-current voltage $V_{AC}$.

When an up edge occurs in the peak detection signal $S_{PEAK}$, base on the most recent period length $t_{PR}$ derived by the period calculation circuit 14, the signal output circuit 16 determines the next up-edge and down-edge timings of the zero-cross detection signal $S_{ZX}$.

For example, the latest period length $t_{PR}$ derived by period calculation circuit 14 at time point $T_{23}$ corresponds to the interval between time points $T_{12}$ and $T_{22}$. Thus, when an up edge occurs in the peak detection signal SPEAK at time point $T_{23}$, the signal output circuit 16 produces an up edge in the zero-cross detection signal $S_{ZX}$ at the lapse, from time point $T_{23}$, of one-fourth of the interval between time points $T_{12}$ and $T_{22}$, and produces a down edge in the zero-cross detection signal $S_{ZX}$ at the lapse, from time point $T_{23}$, of three-fourths of the interval between time points $T_{12}$ and $T_{22}$. Likewise, for example, the latest period length $t_{PR}$ derived by the period calculation circuit 14 at time point $T_{33}$ corresponds to the interval between time points $T_{22}$ and $T_{32}$. Thus, when an up edge occurs in the peak detection signal $S_{PEAK}$ at time point $T_{33}$, the signal output circuit 16 produces an up edge in the zero-cross detection signal $S_{ZX}$ at the lapse, from time point $T_{33}$, of one-fourth of the interval between time points $T_{22}$ and $T_{32}$, and produces a down edge in the zero-cross detection signal $S_{ZX}$ at the lapse, from time point $T_{33}$, of three-fourths of the interval between time points $T_{22}$ and $T_{32}$.

As described above, the IC 10, while being compatible with half-wave rectification, permits proper detection of the zero-crossing of an alternating-current voltage $V_{AC}$.

Some modified versions of the technologies involved in the load driving system SYS will now be presented in the form of a plurality of practical examples. Unless otherwise stated or unless inconsistent, any of the features described above in connection with the embodiment apply to the practical examples described below. For any feature of the practical examples that contradicts one described above, the description given in connection with the practical examples prevails. Unless inconsistent, any feature of any of the plurality of practical examples described below may be applied to any other (i.e., two or more of the plurality of practical examples may be implemented in combination).

Practical Example 1

Practical Example 1 will be described. The input circuit 11 may be provided outside and externally connected to the IC 10. In that case, it can be understood that the IC 10 and the input circuit 11 externally connected to it together constitute a zero-cross detection device.

Practical Example 2

Figure 5:
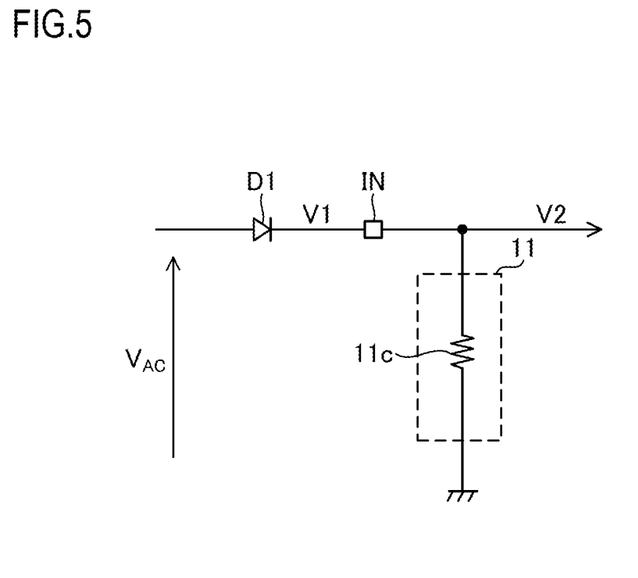
FIG. 5 is a diagram showing a modified configuration of an input circuit in the zero-cross detection IC according to the embodiment of the present disclosure.

Practical Example 2 will be described. In cases where the input voltage $V_{IN}$ has a sufficiently small amplitude or the IC 10 has a sufficiently wide dynamic range, the input circuit 11 may be constituted, as shown in FIG. 5, by a single resistor 11c connected between the input terminal IN and the ground. In that case, the terminal-to-terminal voltage across the single resistor 11c serves as the reference voltage V2; thus the reference voltage V2 equals the input voltage V1 and the judgment voltage $V_{REF}$ equals the threshold voltage $V_{TH}$.

Practical Example 3

Practical Example 3 will be described. The calculation circuit 14 in the IC 10 may be, or may include, a frequency calculation circuit that detects the frequency of the alternating-current voltage $V_{AC}$ based on the comparison result signal $S_{CMP}$. Since the period length $t_{PR}$ is the reciprocal of the frequency of the alternating-current voltage $V_{AC}$, to derive and detect the period length $t_{PR}$ and to derive and detect the frequency of the alternating-current voltage $V_{AC}$ are equivalent to each other. In a configuration where the calculation circuit 14 detects the frequency of the alternating-current voltage $V_{AC}$, the calculation circuit 14 may calculate the reciprocal of the so detected frequency and thereby derive the period length $t_{PR}$.

Practical Example 4

Practical Example 4 will be described.

For any signal or voltage, the relationship between its high and low levels may be reversed so long as that can be done without departure from what has been described above.

While a lighting device is mentioned above as an example of the load device LD, the load device LD may be any load that is driven based on an alternating-current voltage $V_{AC}$. The load device LD is assumed to be, in particular, a load of which the operation is controlled by a microcomputer 20 based on a zero-cross detection signal $S_{ZX}$.

Embodiments of the present disclosure allow for any modifications as necessary within the scope of technical ideas recited in the appended claims. The embodiments described above are merely examples of implementing the present disclosure, and what is meant by any of the terms used to describe what is disclosed herein and the constituent elements of it is not limited to that mentioned in connection with the embodiments. The specific values mentioned in the above description are merely illustrative and needless to say can be modified to different values.

Notes

To follow are supplementary notes on what is disclosed herein of which specific configuration examples have been described above by way of embodiments.

According to one aspect of the present disclosure, a zero-cross detection device (10) includes: an input terminal (IN) configured to receive an input voltage (V1) via a diode (D2) from an application terminal (TM2) for an alternating-current voltage ($V_{AC}$) relative to a reference potential (ground); an input circuit (11) including a resistor between the input terminal and a terminal at the reference potential; a period detection circuit (13, 14) configured to detect the length ($t_{PR}$) of the period of the alternating-current voltage based on the interval of the timings at which the input voltage exceeds a threshold voltage ($V_{TH}$); a peak detection circuit (15) configured to detect the peak timing at which the input voltage reaches a peak in each period of the alternating-current voltage; and a zero-cross timing detection circuit (16) configured to detect the zero-cross timing of the alternating-current voltage based on the results of detection by the period detection circuit and the peak detection circuit. (A first configuration.)

It is thus possible to detect the zero-crossing (zero-cross timing) of an alternating-current voltage in a system that employs half-wave rectification.

In the zero-cross detection device of the first configuration described above, the input circuit may generate a reference voltage (V2) in accordance with the input voltage. The period detection circuit may detect the length of the period based on the reference voltage. The peak detection circuit may detect the peak timing based on the reference voltage. (A second configuration.)

In the zero-cross detection device of the second configuration described above, the input circuit may include a series circuit of a plurality of voltage division resistors (11a, 11b) between the input terminal and the terminal at the reference potential. The series circuit may generate as the reference voltage a division voltage of the input voltage. (A third configuration.)

In the zero-cross detection device of the second or third configuration described above, the period detection circuit may include: a comparator (13) configured to compare the reference voltage and a predetermined voltage ($V_{REF}$); and a calculation circuit (14) configured to derive the length of the period of the alternating-current voltage based on the result of comparison by the comparator. (A fourth configuration.)

It is thus possible to properly derive the length of the period of an alternating-current voltage in a system that employs half-wave rectification.

In the zero-cross detection device of the fourth configuration described above, the calculation circuit may derive as the length of the period of the alternating-current voltage the interval of the timings at which a shift occurs from a state where the reference voltage is lower than the predetermined voltage to a state where the reference voltage is higher than the predetermined voltage. (A fifth configuration.)

In the zero-cross detection device of any of the first to fifth configurations described above, the zero-cross timing detection circuit may detect a zero-crossing of the alternating-current voltage occurring at the lapse of a delay time from the peak timing. The delay time may correspond to one-fourth or three-fourths of the length of the period detected by the period detection circuit. (A sixth configuration.)

In the zero-cross detection device of any of the first to fifth configurations described above, the zero-cross timing detection circuit may detect a positive-to-negative zero-crossing of the alternating-current voltage occurring at the lapse of a first delay time from the peak timing and detect a negative-to-positive zero-crossing of the alternating-current voltage occurring at the lapse of a second delay time from the peak timing. The first delay time may corresponds to one-fourth of the length of the period detected by the period detection circuit and the second delay time may correspond to three-fourths of the length of the period detected by the period detection circuit. (A seventh configuration.)

In the zero-cross detection device of any of the first to seventh configurations described above, the timing at which the input voltage exceeds the threshold voltage is a timing at which a shift occurs from a state where the input voltage is lower than the threshold voltage to a state where the input voltage is higher than the threshold voltage. (An eighth configuration.)

In the zero-cross detection device of any of the first to eighth configurations described above, the zero-cross timing detection circuit may output a zero-cross detection signal ($S_{ZX}$) that indicates the result of detection of the zero-cross timing. (A ninth configuration.)

In the zero-cross detection device of any of the first to ninth configurations described above, a first power input terminal (TM1) may be at the reference potential, relative to which the alternating-current voltage may be applied to a second power input terminal (TM2). The second power input terminal may be connected to the anode of the diode such that the input voltage is applied to the cathode of the diode. (A tenth configuration.)

According to another aspect of the present disclosure, a load driving system (SYS) includes: the zero-cross detection device of the tenth configuration described above; a load device (LD) connected to the first and second power input terminals and configured to be driven based on the alternating-current voltage; a half-wave rectification circuit (D1, C1) connected to the first and second power input terminals and configured to generate a pulsative voltage by performing half-wave rectification and smoothing on the alternating-current voltage; and a control device (20) configured to use as a supply voltage a direct-current voltage generated based on the pulsating voltage and to control the load device based on the result of detection of the zero-cross timing by the zero-cross detection device. (An eleventh configuration.)

What is claimed is:

1. A zero-cross detection device, comprising:
    an input terminal configured to receive an input voltage via a diode from an application terminal for an alternating-current voltage relative to a reference potential;
    an input circuit including a resistor between the input terminal and a terminal at the reference potential;
    a period detection circuit configured to detect a length of a period of the alternating-current voltage based on an interval of timings at which the input voltage exceeds a threshold voltage;
    a peak detection circuit configured to detect a peak timing at which the input voltage reaches a peak in each period of the alternating-current voltage; and
    a zero-cross timing detection circuit configured to detect a zero-cross timing of the alternating-current voltage based on results of detection by the period detection circuit and the peak detection circuit,
    wherein the input circuit generates a reference voltage in accordance with the input voltage,
    the period detection circuit detects the length of the period based on the reference voltage, and
    the peak detection circuit detects the peak timing based on the reference voltage,
    wherein the period detection circuit includes:
        a comparator configured to compare the reference voltage and a predetermined voltage; and
        a calculation circuit configured to derive the length of the period of the alternating-current voltage based on a result of comparison by the comparator, and
    wherein the calculation circuit derives as the length of the period of the alternating-current voltage an interval of timings at which a shift occurs from a state where the reference voltage is lower than the predetermined voltage to a state where the reference voltage is higher than the predetermined voltage.

2. A zero-cross detection device according to claim 1, wherein
    the input circuit includes a series circuit of a plurality of voltage division resistors between the input terminal and the terminal at the reference potential, and
    the series circuit generates as the reference voltage a division voltage of the input voltage.

3. A zero-cross detection device according to claim 1, wherein
    the timing at which the input voltage exceeds the threshold voltage is a timing at which a shift occurs from a state where the input voltage is lower than the threshold voltage to a state where the input voltage is higher than the threshold voltage.

4. A zero-cross detection device according to claim 1, wherein
    the zero-cross timing detection circuit outputs a zero-cross detection signal that indicates a result of detection of the zero-cross timing.

5. A zero-cross detection device according to claim 1, wherein
    a first power input terminal is at the reference potential, relative to which the alternating-current voltage is applied to a second power input terminal, and
    the second power input terminal is connected to an anode of the diode such that the input voltage is applied to a cathode of the diode.

6. A load driving system, comprising:
the zero-cross detection device according to claim 5;
a load device connected to the first and second power input terminals, the load device being configured to be driven based on the alternating-current voltage;
a half-wave rectification circuit connected to the first and second power input terminals, the half-wave rectification circuit being configured to generate a pulsative voltage by performing half-wave rectification and smoothing on the alternating-current voltage; and
a control device configured
to use as a supply voltage a direct-current voltage generated based on the pulsative voltage and
to control the load device based on a result of detection of the zero-cross timing by the zero-cross detection device.

7. A zero-cross detection device, comprising:
an input terminal configured to receive an input voltage via a diode from an application terminal for an alternating-current voltage relative to a reference potential;
an input circuit including a resistor between the input terminal and a terminal at the reference potential;
a period detection circuit configured to detect a length of a period of the alternating-current voltage based on an interval of timings at which the input voltage exceeds a threshold voltage;
a peak detection circuit configured to detect a peak timing at which the input voltage reaches a peak in each period of the alternating-current voltage; and
a zero-cross timing detection circuit configured to detect a zero-cross timing of the alternating-current voltage based on results of detection by the period detection circuit and the peak detection circuit, wherein
the zero-cross timing detection circuit detects a zero-crossing of the alternating-current voltage occurring at a lapse of a delay time from the peak timing, and
the delay time corresponds to one-fourth or three-fourths of the length of the period detected by the period detection circuit.

8. A zero-cross detection device according to claim 7, wherein
the input circuit includes a series circuit of a plurality of voltage division resistors between the input terminal and the terminal at the reference potential, and
the series circuit generates as a reference voltage a division voltage of the input voltage.

9. A zero-cross detection device according to claim 7, wherein
the timing at which the input voltage exceeds the threshold voltage is a timing at which a shift occurs from a state where the input voltage is lower than the threshold voltage to a state where the input voltage is higher than the threshold voltage.

10. A zero-cross detection device according to claim 7, wherein
the zero-cross timing detection circuit outputs a zero-cross detection signal that indicates a result of detection of the zero-cross timing.

11. A zero-cross detection device according to claim 7, wherein
a first power input terminal is at the reference potential, relative to which the alternating-current voltage is applied to a second power input terminal, and
the second power input terminal is connected to an anode of the diode such that the input voltage is applied to a cathode of the diode.

12. A load driving system, comprising:
the zero-cross detection device according to claim 11;
a load device connected to the first and second power input terminals, the load device being configured to be driven based on the alternating-current voltage;
a half-wave rectification circuit connected to the first and second power input terminals, the half-wave rectification circuit being configured to generate a pulsative voltage by performing half-wave rectification and smoothing on the alternating-current voltage; and
a control device configured
to use as a supply voltage a direct-current voltage generated based on the pulsative voltage and
to control the load device based on a result of detection of the zero-cross timing by the zero-cross detection device.

13. A zero-cross detection device, comprising:
an input terminal configured to receive an input voltage via a diode from an application terminal for an alternating-current voltage relative to a reference potential;
an input circuit including a resistor between the input terminal and a terminal at the reference potential;
a period detection circuit configured to detect a length of a period of the alternating-current voltage based on an interval of timings at which the input voltage exceeds a threshold voltage;
a peak detection circuit configured to detect a peak timing at which the input voltage reaches a peak in each period of the alternating-current voltage; and
a zero-cross timing detection circuit configured to detect a zero-cross timing of the alternating-current voltage based on results of detection by the period detection circuit and the peak detection circuit,
wherein
the zero-cross timing detection circuit detects a positive-to-negative zero-crossing of the alternating-current voltage occurring at a lapse of a first delay time from the peak timing and detects a negative-to-positive zero-crossing of the alternating-current voltage occurring at a lapse of a second delay time from the peak timing,
the first delay time corresponds to one-fourth of the length of the period detected by the period detection circuit and
the second delay time corresponds to three-fourths of the length of the period detected by the period detection circuit.

14. A zero-cross detection device according to claim 13, wherein
the input circuit includes a series circuit of a plurality of voltage division resistors between the input terminal and the terminal at the reference potential, and
the series circuit generates as a reference voltage a division voltage of the input voltage.

15. A zero-cross detection device according to claim 13, wherein
the timing at which the input voltage exceeds the threshold voltage is a timing at which a shift occurs from a state where the input voltage is lower than the threshold voltage to a state where the input voltage is higher than the threshold voltage.

16. A zero-cross detection device according to claim 13, wherein
the zero-cross timing detection circuit outputs a zero-cross detection signal that indicates a result of detection of the zero-cross timing.

17. A zero-cross detection device according to claim 13, wherein a first power input terminal is at the reference potential, relative to which the alternating-current voltage is applied to a second power input terminal, and the second power input terminal is connected to an anode of the diode such that the input voltage is applied to a cathode of the diode.

18. A load driving system, comprising:

the zero-cross detection device according to claim 17;

a load device connected to the first and second power input terminals, the load device being configured to be driven based on the alternating-current voltage;

a half-wave rectification circuit connected to the first and second power input terminals, the half-wave rectification circuit being configured to generate a pulsative voltage by performing half-wave rectification and smoothing on the alternating-current voltage; and a control device configured
- to use as a supply voltage a direct-current voltage generated based on the pulsative voltage and
- to control the load device based on a result of detection of the zero-cross timing by the zero-cross detection device.

19. A load driving system, comprising:

an input terminal configured to receive an input voltage via a diode from an application terminal for an alternating-current voltage relative to a reference potential;

an input circuit including a resistor between the input terminal and a terminal at the reference potential;

a period detection circuit configured to detect a length of a period of the alternating-current voltage based on an interval of timings at which the input voltage exceeds a threshold voltage;

a peak detection circuit configured to detect a peak timing at which the input voltage reaches a peak in each period of the alternating-current voltage;

a zero-cross timing detection circuit configured to detect a zero-cross timing of the alternating-current voltage based on results of detection by the period detection circuit and the peak detection circuit, wherein a first power input terminal is at the reference potential, relative to which the alternating-current voltage is applied to a second power input terminal, and the second power input terminal is connected to an anode of the diode such that the input voltage is applied to a cathode of the diode;

a load device connected to the first and second power input terminals, the load device being configured to be driven based on the alternating-current voltage;

a half-wave rectification circuit connected to the first and second power input terminals, the half-wave rectification circuit being configured to generate a pulsative voltage by performing half-wave rectification and smoothing on the alternating-current voltage; and a control device configured to use as a supply voltage a direct-current voltage generated based on the pulsative voltage, and to control the load device based on a result of detection of the zero-cross timing.

\* \* \* \* \*